United States Patent [19]

Muellner et al.

[11] 4,156,845

[45] May 29, 1979

[54] APPARATUS FOR IDENTIFYING FAULTY DIODES IN AUTOMOTIVE ALTERNATORS

[75] Inventors: Frank J. Muellner, Chicago, Ill.; Richard G. Volk, York, Pa.

[73] Assignee: K-D Manufacturing Company, Lancaster, Pa.

[21] Appl. No.: 803,877

[22] Filed: Jun. 6, 1977

[51] Int. Cl.$^2$ .................. G01R 31/22; G01R 31/02
[52] U.S. Cl. .................... 324/158 D; 324/15; 324/158 MG
[58] Field of Search ............. 324/158 MG, 158 D, 15; 322/99

[56] References Cited

U.S. PATENT DOCUMENTS

| | | | |
|---|---|---|---|
| 3,629,704 | 12/1971 | Stevens | 324/158 MG |
| 4,019,120 | 4/1977 | Fattic | 324/158 MG |

Primary Examiner—Rudolph V. Rolinec
Assistant Examiner—Ernest F. Karlsen
Attorney, Agent, or Firm—Paul & Paul

[57] ABSTRACT

Faulty alternator diodes are identified by detection of a voltage ripple across the terminals of the automotive storage battery. A diode is forward biased whenever the battery has adequate charge to be designated a "good battery", and the forward bias condition is utilized as a reference potential. A voltage divider scales the reference potential, and couples it to the inverting terminal of a comparator. The non-inverting terminal is biased at a predetermined differential from the inverting terminal, and the probe signal is AC coupled to the non-inverting terminal. If a diode is bad, the superposition of the AC with the bias will switch the comparator and energize a light emitting diode.

13 Claims, 7 Drawing Figures

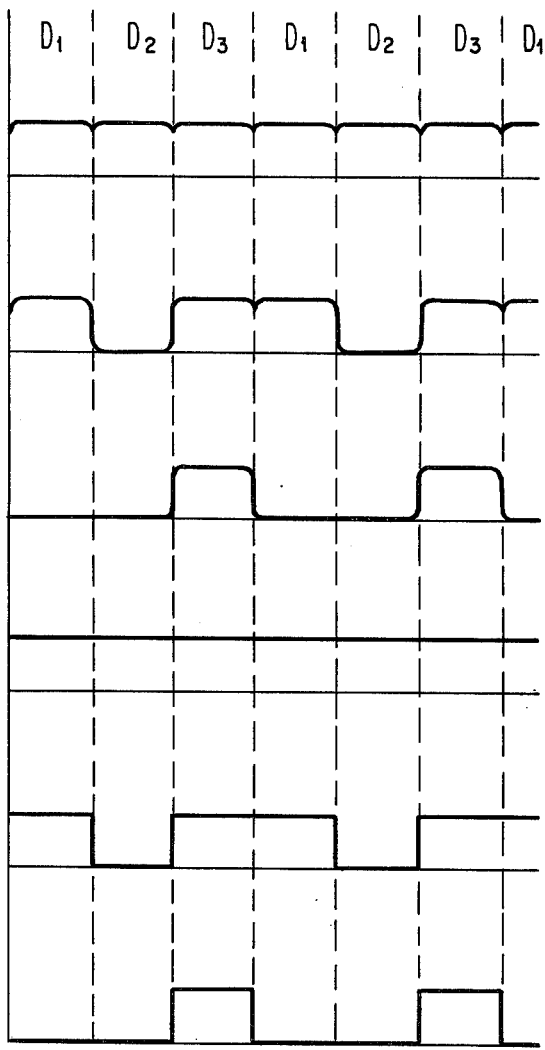

APPARATUS FOR IDENTIFYING FAULTY DIODES IN AUTOMOTIVE ALTERNATORS

BACKGROUND OF THE INVENTION

This invention relates to apparatus for identifying failure of charging diodes in automotive electrical systems, and particularly the charging diodes intermediate the alternator and storage battery thereof.

Conventional automotive electrical systems involve a storage battery providing DC power for engine start-up and the like, and an alternator which is mechanically driven by the operating engine, and which provides AC signals for utilization by the car. Among other applications of the AC from the alternator is the maintenance of a suitable charging level in the storage battery. Conventionally, the three phase AC alternator output is coupled to a diode network for conversion to DC, which is coupled for charging to the automotive battery. This diode network generally involves three diodes having their cathodes connected in common, and their anodes coupled to respective alternator output phrases.

It is a primary object of the present invention to provide apparatus for identifying failure of charging diodes intermediate the alternator and storage battery of an automotive electrical system.

When all three charging diodes are operating properly, each is providing the DC for approximately one third of the cycle, with a small amount of irregularity or ripple therein. This unavoidable irregularity in the signal will have an amplitude range dependent on the charge level of the battery, and the electrical load imposed on the system. Low battery charge level and other loads (e.g., auto headlights, horn, etc.) tend to burden the alternator, and under such conditions the alternator output is somewhat irregular. So long as the charging diodes are functioning properly and the storage battery is undamaged and capable of being recharged, however, the amount of ripple normally encountered in the alternator output waveform is rather small, for example on the range of 0.005 to 0.01 volts.

If one or more of the charging diodes should fail, such as due to vibration, shock, electrical burn out/failure, or the like, the alternator output waveform becomes considerably distorted, since for a substantial portion of each output waveform period, no rectified voltage is being furnished.

It is a more specific object of the present invention to detect charging diode failure at the battery terminals by discriminating excessive ripple from normal ripple in the alternator output waveform.

It is a still further object that such apparatus be compact and simple, and have sufficiently high input impedance that it provides minimal loading on the circuit being evaluated.

SUMMARY OF THE INVENTION

The present invention involves detection of ripple in the alternator output waveform by utilizing that waveform selectively to alter the balance of the inputs of a comparator-amplifier. The comparator is biased as a function of the DC level across the battery terminals, with a differential between inputs. The AC waveform between the terminals is coupled to the bias network in such a fashion that normal ripple amplitudes will not affect the circuit, whereas ripple corresponding to diode failure, in superposition with the bias levels, will switch the comparator-amplifier and indicate a bad diode condition.

In an illustrative embodiment, respective probes are coupled to positive and negative terminals of the storage battery, thereby providing source and datum voltages. The source voltage is coupled to a diode network which is forward biased upon a "good battery" condition, and which thence establishes a reference potential. A resistive divider scales the reference and couples it to the inverting terminal of a comparator, and the reference is directly resistively coupled to the non-inverting terminal. By means of a capacitor, the AC component of the signal delivered between the alternator and the battery is coupled to the latter resistive coupling. If the ripple is sufficiently great in amplitude, the comparator output is switched, and energizes a light emitting diode.

DESCRIPTION OF THE DRAWINGS

FIGS. 2a through 2c and 3a through 3c show waveforms relating to the operation of the FIG. 1 embodiment.

DETAILED DESCRIPTION

Figure 1:
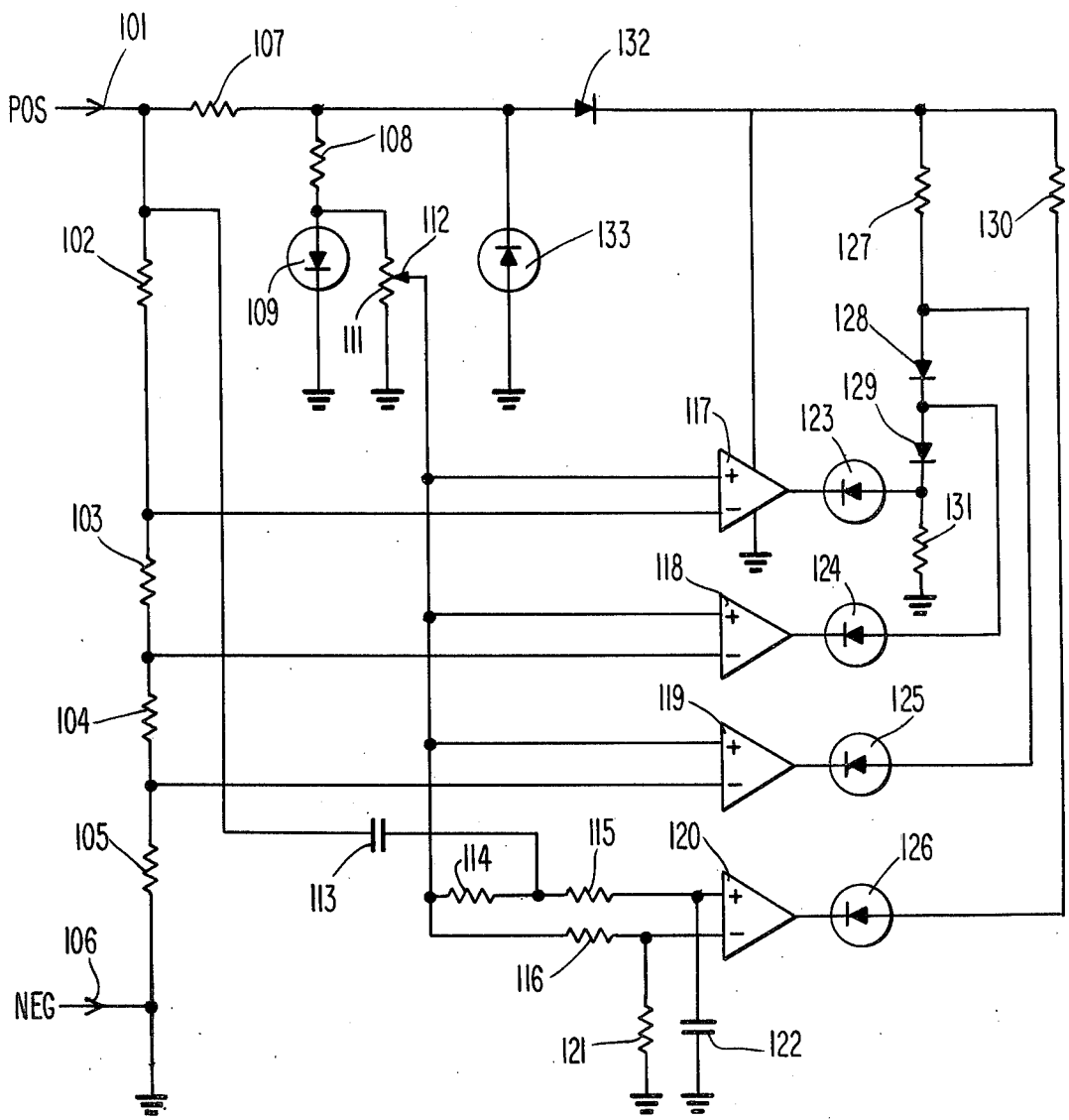
FIG. 1 shows a schematic diagram of a circuit embodiment of the principles of the present invention.

In the attached drawing, there is shown, in schematic form, a circuit which is adapted not only to sense bad charging diodes in the automotive alternator-battery circuit, but also to evaluate the battery charge level.

Referring to FIG. 1, respective positive and negative probes 101 and 106 are coupled to the positive and negative terminals of the storage battery of the automotive system to be tested. It will be understood that the connections 101 and 106 may be hard-wired into the automotive system, thereby to give the operator a continuous indication of the status of his automotive electrical system, or alternatively may be embodied in a convenient hand-held system to be utilized when diagnostics are appropriate. It will also be understood that polarities may be reversed throughout the system to achieve the same results while designating the positive terminal as datum (i.e., "ground") rather than negative terminal 106 as shown.

The embodiment shown features four comparators 117, 118, 119, and 120 in order to sense various battery charging levels and to detect a bad charging diode condition. The comparators 117 through 120 advantageously are embodied by a variety of commercially available items, such as the integrated circuits manufactured by National Semiconductor Corporation under the trade designation LM 138/239/339 Series. It is common commercially to provide plural individual comparator circuits on a single integrated circuit chip. In the embodiment shown, it is understood that the four comparators 117 through 120 constitute a single "quad-comparator" chip, and it is also understood that the designated interconnection of comparator 117 with the positive source potential and with ground similarly provides those connections to comparators 118, 119, and 120, although for simplicity such connections are not shown in the drawing.

The embodiment shown in the drawing also includes several light emitting diodes 109, 123, 124, 125, 126, and 133. These elements too are of common operational characteristics, and are embodied by any of the large variety of such elements which are available commercially.

Positive terminal 101 is connected to negative terminal 106 by means of a series voltage divider made up of resistors 102, 103, 104, and 105. Resistors 102 through 105 respectively successively scale the voltage between the positive terminal 101 and the negative terminal 106, and thereby provide DC reference values for evaluation of the charging level of the storage battery. Hence, the point intermediate resistors 102 and 103 is coupled to the inverting input terminal of comparator 117, the voltage intermediate resistors 103 and 104 is coupled to the inverting input terminal of comparator 118, and the voltage intermediate resistors 104 and 105 is coupled to the inverting input of comparator 119. The three reference voltage obtained from intermediate points between resistors 102 and 103, 103 and 104, and 104 and 105, respectively are chosen to correspond to overcharge, normal charge, and undercharge battery charging level conditions.

The non-inverting input terminals of comparators 117, 118, and 119 are each coupled to the intermediate point 112 of a potentiometer divider 111, which provides comparators 117, 118 and 119 a reference potential to which the voltage provided at their respective inverting terminals may be compared. Hence, the positive probe 101 is coupled through resistors 107 and 108 to light emitting diode 109, which in turn is coupled to ground in parallel with potentiometer-divider 111. Resistors 107, 108, and 111 are selected such that diode 109 constitutes a "bad battery" indication. If the battery voltage is less than a preselected voltage corresponding to a bad battery (e.g., five volts), diode 109 will not be forward biased. So long as the battery is charged above that level, diode 109 will be energized, and its forward bias voltage (e.g., 1.5 volts) will be divided across potentiometer 111, with the divider voltage at brush 112 being coupled as previously described to comparators 117, 118, and 119.

Depending upon the battery voltage between terminals 101 and 106, and the division thereof among resistors 102, 103, 104, and 105, one, two, or all three of comparators 117, 118, and 119 will be switched from their normally nonconducting to the conducting condition, and their output terminals will respectively be switched to ground potential. Under such circumstances, light emitting diodes 123, 124, and 125 are capable of conduction, depending upon the voltage provided to their anodes.

As will be appreciated from the drawing, the potential of positive terminal 101 is coupled via resistor 107 and diode 132 to a series network made up of resistor 127, diodes 128 and 129, and resistor 131. The anodes of light emitting diodes 125, 124, and 123 are respectively coupled to the points intermediate resistor 127 and diode 128, diode 128 and diode 129, and diode 129 and resistor 131. Thus, if only comparator 117 is switched into the conducting state, light emitting diode 123 will be energized, indicating a battery charging level corresponding to the voltage between resistors 102 and 103 (i.e., low battery charge level). If, however, the battery voltage across terminals 101 and 106 is sufficiently great that both comparators 117 and 118 are switched into the conductive condition, light emitting diode 124 will be energized, and its fixed forward bias potential will keep the anode of diode 123 sufficiently low as to be nonconducting. A "fully charged battery" condition may thereby be indicated by appropriate selection of the resistors 102 through 105. Finally, in similar fashion, if the battery voltage across terminals 101 and 106 is so great that all three comparators 117, 118, and 119 are placed in the conductive condition, light emitting diode 125 will be energized, and light emitting diodes 123 and 124 will thereby be disabled. A "battery overcharge" condition is thereby indicated, based on the selection of resistors 102 through 105.

In partial summary, the embodiment set forth in the drawing provides facility for measurement of battery charging levels, with the conditions of light emitting diodes 123, 124, and 125 respectively indicating below normal, normal, or above normal battery charge levels.

The operation of the principles of the present invention, which relate to detection of bad charging diodes, will be apparent from the following discussion of the operation of the fourth comparator 120. Comparator 120 has its output coupled to the cathode of a light emitting diode 126, which has its anode coupled to the positive source terminal 101 through resistor 130, diode 132, and resistor 107. Hence, when the output of comparator 120 is at ground potential, diode 126 conducts and is lit; alternatively, the output of comparator 120 is "high", essentially at the positive source voltage of 101, and diode 126 is disabled. The output state of comparator 120 is dependent on the relative amplitudes of signals at its respective inverting and non-inverting inputs.

The fixed reference potential from wiper 112 of potentiometer-divider 111 is coupled to the inverting input terminal of comparator 120 through resistor 116, and thence to ground through resistor 121. Thus, resistors 116 and 121 form a voltage divider such that the DC bias of the inverting input terminal of comparator 120 sits at a predetermined bias potential which is a specified fraction of the reference potential from terminal 112 by virtue of the standard resistance voltage divider formula.

The reference potential from terminal 112 of potentiometer 111 is also coupled to the non-inverting input of amplifier 120 through resistors 114 and 115. A capacitor 122 couples the non-inverting input terminal to ground. Thus, except for leakage current into amplifier 120 and through capacitor 122 (both of which are minuscule and may for practical purposes be ignored), the DC bias of the non-inverting input terminal of amplifier 120 is essentially equal to the reference potential at wiper terminal 112 of potentiometer 111.

The positive terminal 101 is connected through a capacitor 113 to the node intermediate resistors 114 and 115. This connection has the effect of isolating DC, but passing time variant signals at positive terminal 101 to the node intermediate resistors 114 and 115. Accordingly, comparator 120 receives via capacitor 113 ripple signals received at the battery terminals from the alternator, with the input terminals of amplifier 120 receiving the superposition of those time variant ripple signals upon their respective DC bias potentials.

In a preferred embodiment, resistors 114 and 115 together form a series resistance equal in magnitude to that of resistor 116. Hence, receipt of the time variant ripple signal through capacitor 113 alters the imbalance between the inverting and non-inverting inputs which was established by the DC biasing inputs of resistors 114, 115, 116, and 121. Those resistors are selected such that normally the output comparator 120 is "high", and diode 126 is nonconductive. Further, the preset bias differential between the two input terminals is selected in accordance with anticipated ripple amplitudes (e.g., 0.08 volts). Hence, ripple normally associated with good diodes will be of insufficient amplitude to switch comparator 120, while receipt of a ripple signal via capacitor 113 corresponding to a bad diode condition will switch the output of comparator 120, energizing diode 126 to conduct and emit light.

Capacitor 122 couples the non-inverting input of comparator 120 to ground, and acts as a high frequency filter for transients, switching spikes, and the like, preventing them from improperly switching comparator 120. Capacitor 122 has no effect, however, on lower frequency signals such as ripple associated with one or two bad charging diodes intermediate the automobile alternator and storage battery.

This operation may perhaps be better understood upon consideration of FIGS. 2a through 2c and 3a through 3c. Specifically, FIGS. 2a through 2c illustrate typical waveforms across terminals 101 and 106, with FIG. 2a representing the normal condition of three charging diodes functioning properly, FIG. 2b indicating that one of the three diodes (i.e., indicated as $D_2$) is not functioning, and FIG. 2c indicating a condition wherein two diodes (i.e., designated as $D_1$ and $D_2$) are not functioning properly. FIGS. 3a through 3b show the corresponding output states for comparator 120 for the same three conditions as shown in FIGS. 2a through 2c; that is, with FIGS. 3a through 3c representing the output waveform of comparator 120 in respective correspondence to the incidence of the waveforms of FIGS. 2a through 2c across terminals 101 and 106. In FIG. 3a, the normal condition, comparator 120 has its output in the "high" state notwithstanding the small ripple in FIG. 2a, and diode 126 is nonconductive. In FIGS. 3b and 3c, the output terminal of comparator 120 is switched to the "low" state in respective correspondence to the bad diode conditions in waveforms 2b and 2c. Each time the output of comparator 120 goes "low", diode 126 is conductive. Since the frequency of change is on the order of 200 hertz, the blinking of the diode 126 is not apprehended by the observer, and diode 126 appears always to be on, except that in the FIG. 3c instance, diode 126 may appear to be lit brighter than in the waveform 3b instance.

One other feature included in the embodiment of FIG. 1 relates to a configuration of diodes utilized in certain brands of automobiles, for example those manufactured by General Motors, Inc. In these cars, in addition to the charging diodes discussed hereinbefore, there is included a so called "diode trio" which activate a warning light on the dashboard panel when the alternator is not functioning properly. Typically this diode trio converts the alternate output to a rectified voltage, which is coupled through the dashboard warning light to the battery positive terminal.

The embodiment of FIG. 1 utilizes light emitting diode 133 to detect failure of one diode of the "diode trio". To do so, terminals 101 and 106 are coupled to respective negative and positive terminals of the alternator harness. If one or more diodes of the diode trio are bad, light emitting diode 133 will be lit.

Following are illustrative component values utilized in a preferred embodiment of the present invention:

Resistor 102—27 K
Resistor 103—270 Ohms
Resistor 104—220 Ohms
Resistor 105—2.2 K
Resistor 107—470 Ohms
Resistor 108—62.2 K
Resistor 111—1 K
Resistor 127—1 K
Resistor 131—Optional
Resistor 130—820 Ohms
Resistor 114—82 K
Resistor 115—18 K
Resistor 116—100 K
Resistor 121—1 M
Capacitor 113—0.01 MFD
Capacitor 122—300 PFD The foregoing has set forth illustrative and preferred forms of the present invention, but it is to be understood that numerous alternative embodiments will occur to those of ordinary skill in the art without departure from the spirit or scope thereof.

We claim:

1. In an automotive electrical system containing, an alternator having a polyphase output winding with a full wave bridge rectifier connected thereto, a battery connected across the direct current output terminals of said bridge rectifier to be charged thereby, and a voltage regulator interconnected with said battery and said rectifier output, an electric circuit for identifying a failure therein, comprising:

(a) first electrical connection with a first terminal of said battery;
   (b) a second electrical connection with the other terminal of said battery;
   (c) means including a differential comparator, for comparing the difference between two signals input thereto and for establishing an output state therefrom as a function of said compared difference exceeding a predetermined minimum, said comparing means having a reference input and a sensing input, said comparing means and said second electrical connection being electrically referenced to a common electrical potential;
   (d) means for providing a photo signal of current flow, said photo signal means being connected between said comparing means output and said first battery connection;
   (e) means for coupling both said comparing means reference input and sensing input to said first battery connection, said coupling means providing an AC and DC current path; and
   (f) means for additional AC coupling only, of said first battery connection to said comparing means sensing input.

2. The circuit of claim 1 also including means for adjusting the sensitivity of said comparing means, being connected to said reference input thereof.

3. The circuit of claim 2 also including means for filtering transient alternator noise from said comparing means sensing input, being connected thereto.

4. The circuit of claim 3 also including means, associated with said first and second battery terminal connections and with said AC and DC coupling means, for providing, selectively, a plurality of visual signals indicating, exclusively, a battery overcharge, battery undercharge and battery normal charge condition.

5. The circuit of claim 3 wherein said sensing input is said comparator non-inverting input, and said reference input is said comparator inverting input.

6. The circuit of claim 5 wherein said AC and DC coupling means includes:

(a) means for scaling down AC and DC components of a signal, said scaling means being connected to said first battery connection; and (b) means for distributing said scaled down AC and DC component signal to said comparator inverting and non-inverting inputs.

7. The circuit of claim 6 wherein said AC only coupling means includes a capacitance connected between said first battery connection and an intermediate point within said distributing means, said point being more adjacent to said comparator non-inverting input than said inverting input.

8. The circuit of claim 7 wherein said scaling down means includes:
(a) a first resistance connected to said first battery connection;
(b) a diode connected between said first resistance and said second battery connection; and
(c) a potentiometer connected between the connection point of said first resistance to said diode and said second battery connection, said potentiometer having a variable intermediate resistance output.

9. The circuit of claim 8 wherein said distributing means includes:

(a) a second resistance connected between said inverting input and said potentiometer output;
(b) a third resistance connected to said potentiometer output; and
(c) a fourth resistance connected between said third resistance and said non-inverting input.

10. The circuit of claim 9 wherein the sum resistance of said third and fourth resistances equals said second resistance.

11. The circuit of claim 10 wherein said AC coupling capacitance is connected between said second battery connection and the interconnection of said third and fourth resistances, said third resistance being of substantially larger magnitude than said fourth resistance.

12. The circuit of claim 11 wherein said sensitivity adjusting means includes a fifth resistance connected between said inverting input and said second battery connection.

13. The circuit of claim 12 wherein said noise filtering means includes a second capacitance connected between said non-inverting input and said second battery connection.

* * * * *

UNITED STATES PATENT OFFICE
CERTIFICATE OF CORRECTION

Patent No. 4,156,845    Dated May 29, 1979

Inventor(s) Frank J. Mueller and Richard G. Volk

It is certified that error appears in the above-identified patent and that said Letters Patent are hereby corrected as shown below:

In Column 2, line 52 after the words "designation LM" delete "138" and insert therefore --139--

*Signed and Sealed this*

*Thirteenth* Day of *November 1979*

[SEAL]

Attest:

RUTH C. MASON
*Attesting Officer*

LUTRELLE F. PARKER
*Acting Commissioner of Patents and Trademarks*